United States Patent [19]

Saito

[11] Patent Number: 4,602,420
[45] Date of Patent: Jul. 29, 1986

[54] METHOD OF MANUFACTURING A SEMICONDUCTOR DEVICE

[75] Inventor: Shozo Saito, Yokohama, Japan

[73] Assignee: Kabushiki Kaisha Toshiba, Kawasaki, Japan

[21] Appl. No.: 681,294

[22] Filed: Dec. 13, 1984

[30] Foreign Application Priority Data

Feb. 23, 1984 [JP] Japan .................................. 59-32830

[51] Int. Cl.⁴ ...................... H01L 21/263; B23K 26/00
[52] U.S. Cl. .......................................... 29/571; 29/575;
29/578; 148/1.5; 148/DIG. 55; 148/DIG. 93;
427/53.1; 357/42; 219/121 L; 219/121 LF;
219/121 LE
[58] Field of Search ...................... 29/571, 576 C, 577,
29/577 C, 578, 591, 575; 148/1.5, 187, DIG. 55,
DIG. 91, DIG. 93; 427/53.1; 219/121 L, 121
LE, 121 LF, 121 LG, 121 LH, 121 LJ, 121 EF;
357/42

[56] References Cited

U.S. PATENT DOCUMENTS

| | | | |
|---|---|---|---|
| 3,330,696 | 7/1967 | Ullery et al. | 219/121 LJ X |
| 3,584,183 | 6/1971 | Chiaretta et al. | 219/121 LJ |
| 3,649,806 | 3/1972 | Konig | 219/121 LF X |
| 4,217,570 | 8/1980 | Holmes | 219/121 LJ X |
| 4,288,776 | 9/1981 | Holmes | 219/121 LJ X |
| 4,413,020 | 11/1983 | McKee et al. | 219/121 LN X |
| 4,462,150 | 7/1984 | Nishimura et al. | 148/187 X |
| 4,503,315 | 3/1985 | Kamioka et al. | 219/121 EF X |
| 4,523,372 | 6/1985 | Balda et al. | 29/591 X |

FOREIGN PATENT DOCUMENTS

| | | |
|---|---|---|
| 0025347 | 3/1981 | European Pat. Off. . |
| 0083211 | 7/1983 | European Pat. Off. . |
| 58-47596 | 10/1983 | Japan . |
| 2098300 | 11/1982 | United Kingdom . |

OTHER PUBLICATIONS

Kristoff et al., "Process for Ething Self-Aligned Concentric Vial Contact Holes", IBM Tech. Disc. Bull., vol. 22, No. 12, May 1980, pp. 5321-5322.

Braslav et al., "Laser Engineering Change Capability for Microcircuit Metallurgy", IBM Tech. Disc. Bull., vol. 21, No. 9, Feb. 1979, pp. 3838-3839.

IBM Technical Disclosure Bulletin, vol. 23, No. 10, Mar. 1981.

Primary Examiner—Donald L. Walton
Assistant Examiner—David A. Hey
Attorney, Agent, or Firm—Finnegan, Henderson, Farabow, Garrett & Dunner

[57] ABSTRACT

A method of manufacturing a semiconductor device including the steps of forming a passivation film, which has an opening exposing that region of the interlayer insulation film formed on the fuse element, which corresponds to the region to be melted of fuse element, melting the region of the fuse element to be melted by radiating a laser beam on the exposed region of the interlayer insulation film through the opening, and the step of forming a protective resin layer on the whole main surface of the resultant structure after melting is completed.

9 Claims, 8 Drawing Figures

F I G. 2F
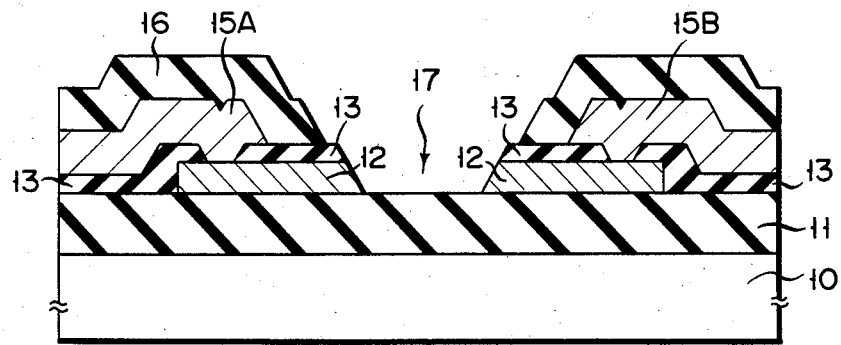
F I G. 2G
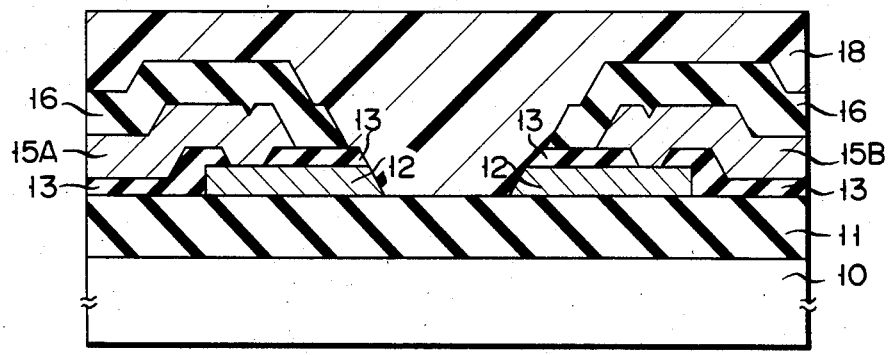

METHOD OF MANUFACTURING A SEMICONDUCTOR DEVICE

BACKGROUND OF THE INVENTION

This invention relates to a method of manufacturing a semiconductor device.

Recently, the memory capacity in VLSI (very large scale integration) semiconductor devices has increased drastically and the size of the individual elements has become exceedingly tiny. Along with this, there has been an increase in the ratio of faulty elements produced. Chips which include any faulty elements are considered faulty, which reduces the production yield. In order to solve this problem, spare circuits are formed in the chip, and when a faulty element is detected, these spare circuits are used in place of the faulty ones to increase the yield of the device. Namely, the yield is increased by providing the chips with redundancy.

In the prior art, a spare programmable decoder comprising a plurality of programming fuse elements is provided in the chip as the means by which spare circuits can be built into the system. When a faulty element is detected, the fuse elements of the spare decoder are selectively melted and the decoder is programmed to replace the circuits containing the faulty elements.

FIG. 1 is a cross-sectional view of prior art semiconductor, which has a spare decoder comprising programming fuse elements. For the sake of simplicity only one fuse element is shown.

A prescribed pattern fuse element 3 of polycrystalline silicon is formed on top of a field oxide film 2, which is on a semiconductor substrate 1. Fuse element 3 is covered by a thin interlayer insulation film 4. Contact holes 5A and 5B are formed in the insulation layer 4 at specified positions leading to the fuse element 3. Semiconductor wiring layers 6A and 6B, which are respectively in contact with the fuse element 3 by way of the contact holes 5A, 5B, are formed on the interlayer insulation film 4. A passivation film 7, which is approximated 10,000 Å thick, is formed over the whole main surface of the structure. In the prior art, the fuse element 3 is melted by flowing a large current and by radiating a laser beam on the fuse element 3 through passivation film 7 and interlayer insulation film 4. With the decrease in size of the circuit patterns, the laser beam melting method has been used increasingly.

The strength of the laser beam that is used for melting the fuse element 3 varies with the material and the thickness of the material of the interlayer insulation film 4 and the passivation film 7. If, for example, the material is thick, the energy level must be set higher than when it is thin. There are, however, fluctuations in the thickness of the insulation film, so if the energy level of the laser beam is set for the average thickness, some fuse elements 3 may not be melted. If, in this kind of situation, the energy level of the laser beam is increased to ensure that all the fuse elements will be melted, those regions of the passivation film 7 and interlayer insulation film 4 which are close to the region to be melted of the fuse element 3 will be damaged. Therefore, highly reliable semiconductor devices were not possible with the prior art method of manufacture.

SUMMARY OF THE INVENTION

In consideration of the above, the object of this invention is to provide a method of manufacturing a semiconductor device by which the melting success rate of the fuse elements is high and the reliability of the products is improved.

There is provided a method of manufacturing a semiconductor device comprising the steps of forming a field insulation film on a semiconductor substrate, forming a fuse element on said field insulation film, forming an interlayer insulation film, which has an opening to said fuse element, on said fuse element, forming wiring layers, which contact said fuse element through said contact holes, on said interlayer insulation film, forming a passivation film, which has an opening above said interlayer insulation film and a region corresponding to the region of said fuse element to be melted, over the whole main surface of the resultant structure, melting an exposure region of said interlayer insulation film that is exposed by said opening and said region of said fuse element to be melted using a melting method, and forming a protective layer on the whole surface of the resultant structure after said melting step.

BRIEF DESCRIPTION OF THE DRAWINGS

FIGS. 2A to 2G are cross sections of the structure of the semiconductor during each stage of manufacture according to the method of this invention.

DETAILED DESCRIPTION OF THE PREFERRED EMBODIMENT

The following is a description of the first embodiment of the invention given with reference to FIGS. 2A to 2G.

Figure 1:
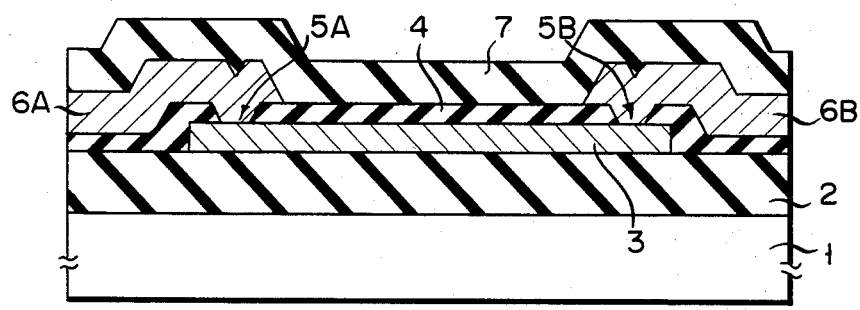
FIG. 1 is a cross section of a prior art semiconductor equipped with a redundancy circuit.
Figure 2A:
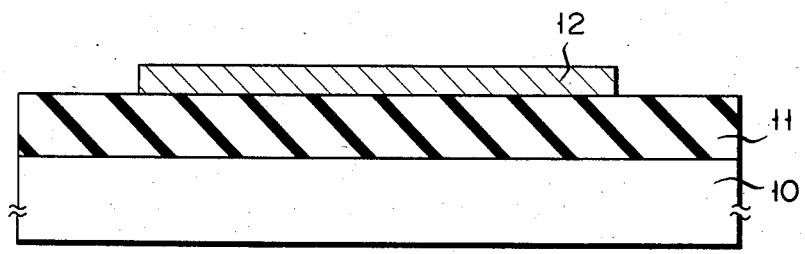

As is shown in FIG. 2A, a field oxide film 11 is formed on a substrate 10 of, for example, silicon, by a thermal oxide method (FIG. 2A). Next, a conductive material such as polycrystalline silicon is formed on the field oxide film 11 by CVD (chemical vapour deposition). Then a fuse element 12 with a prescribed pattern is formed on the field oxide film 11 using a well-known PEP (photoengraving process) (FIG. 2A).

Figure 2B:
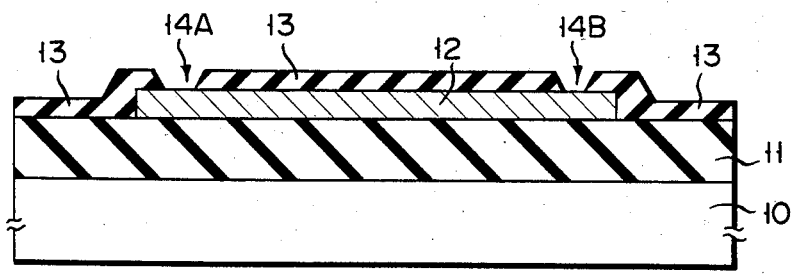

Next, an interlayer insulation film 13, of $SiO_2$, for example, is formed by CVD over the whole main surface of the resultant structure to a thickness of about 3000 Å. Contact holes 14A, 14B are formed by PEP at prescribed locations in the interlayer insulation film 13 and connect with the fuse element 12 (FIG. 2B). These contact holes are for forming semiconductor wiring layers 15A, 15B (to be described later) which contact fuse element 12.

Figure 2C:
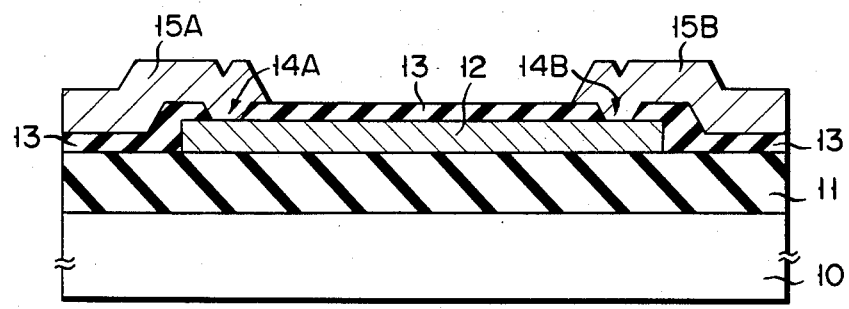

Next, a conductive layer of, for example, aluminum is formed over the whole main surface of the resultant structure by CVD. By patterning this conductive layer using, for example, PEP, mutually isolated conducting wiring layers 15A, 15B, which contact fuse element 12 through contact holes 14A, 14B are formed (FIG. 2C).

Figure 2D:
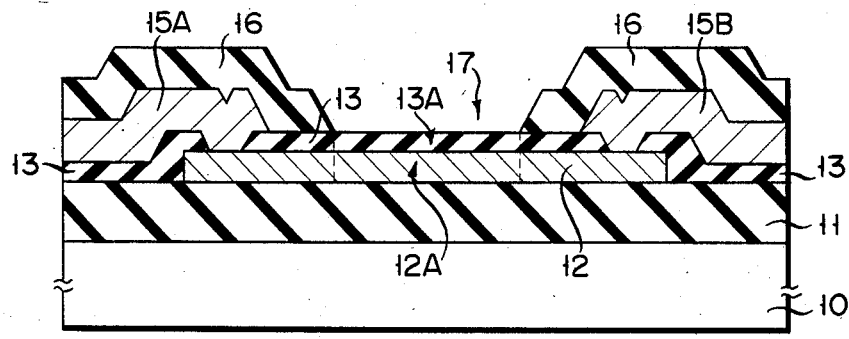
Figure 2E:
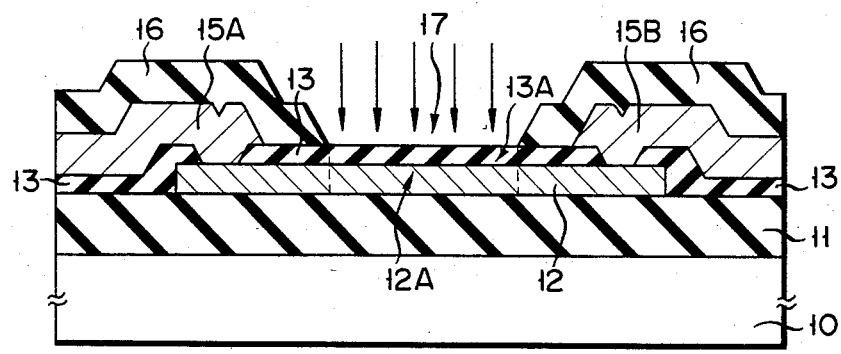

A passivation film 16 of, for example, PSG (phosphorous silicon oxide glass) is then formed over the whole main surface of the resultant structure to a thickness of about 10,000 Å using CVD. This passivation film is then patterned by PEP to form an opening 17 in the region corresponding to the region 12A of fuse element 12 to be melted (FIG. 2D). It is possible to form opening 17 in the same process together with the opening for the bonding pad.

An exposure region 13A of the interlayer insulation film 13 is irradiated with a YAG laser, for example, through opening 17, as shown by the arrows in FIG.

2E. Namely, the laser beam is radiated on the region 12A of fuse element 12 to be melted through the region 13A of interlayer insulation film 13 exposed by opening 17. The diameter of the laser beam is normally about 5-6μm. By irradiating the area with a laser beam, the exposure region 13A of the interlayer insulation film 13 and the area 12A to be melted of fuse element 12 are scattered and disappear, and the opening 17 extends to the field oxide film 11 (FIG. 2F).

After this, a resin protective layer 18 is formed over all of the main surface of the resultant structure (FIG. 2G). It is desirable to use a resin having an alpha particle screening function. By screening the alpha particles to the memory cell region (not shown), it is possible to prevent so-called soft errors, thus giving the protective layer 18 two functions. In this case, the protective layer 18 and the layer on the memory cell are formed by the same process so that work can be reduced. If the protective layer 18 is given this kind of dual function, a polyimide resin is used.

As was described in the above embodiment, the region of passivation film 16 corresponding to the region 12A of fuse element 12 to be melted is removed beforehand, and with only the interlayer insulation film 13 on the region 12A of the fuse element 12 to be melted, the laser beam is radiated onto the area 12A through the removed region of the passivation film 16 to melt the fuse element 12. The laser beam is radiated onto region 12A, not through the thick passivation film 16 of about 10,000 Å, but rather only through the relatively thin interlayer insulation film 13. Consequently, uneven melting due to fluctuations in the thickness of the passivation film 16 are eliminated and melting of the fuse element 12 can be performed with a very high success rate. Also, because the laser beam passes only through a relatively thin interlayer insulation film 13, a high level of energy is not required and, consequently, regions of the passivation film 16 and interlayer insulation film 13 that are close to the region 12A to be melted are not damaged. As it is possible to form opening 17 in the same process that the bonding pad opening is formed, manufacturing is simplified.

As is clear from the above, according to the invention, a method of manufacturing a semiconductor is provided in which the melting success rate is improved without damaging the elements.

What is claimed is:

1. A method of manufacturing a semiconductor device comprising the steps of:

forming a field insulation film on a semiconductor substrate;

forming a fuse element on said field insulation film;

forming an interlayer insulation film, which has a hole leading to said fuse element, on said fuse element;

forming wiring layers, which contact said fuse element through said hole, on said interlayer insulation film;

forming a passivation film, which has an opening above said interlayer insulation film and a region corresponding to the region of said fuse element to be melted, over the whole main surface of the resultant structure;

melting an exposure region of said interlayer insulation film that is exposed by said opening and said region of said fuse element to be melted using a melting method; and forming a protective layer on the whole surface of the resultant structure after said melting step.

2. A method of manufacturing a semiconductor device according to claim 1, wherein said melting method of said fuse element is with radiation by a laser beam.

3. A method of manufacturing a semiconductor device according to claim 1, wherein said protective layer is a resin.

4. A method of manufacturing a semiconductor device according to claim 3, wherein said resin layer has an alpha particle screening effect.

5. A method of manufacturing a semiconductor device according to claim 4, wherein said resin layer is a polyimide resin.

6. A method of manufacturing a semiconductor device according to claim 1, wherein said interlayer insulation film is substantially 3000 Å thick.

7. A method of manufacturing a semiconductor device according to claim 1, wherein said passivation layer is 10,000 Å thick.

8. A method of manufacturing a semiconductor device according to claim 1, wherein said step of forming said interlayer insulation film includes the steps of forming an insulation film on said fuse element by CVD (chemical vapour deposition), and patterning said insulation film by PEP (photoengraving process).

9. A method of manufacturing a semiconductor device according to claim 1, wherein said step of forming said passivation film includes the steps of forming a passivation layer over the whole main surface of the resultant structure and patterning said passivation layer by PEP.

* * * * *